United States Patent [19]

Andreev et al.

[11] 4,162,415
[45] Jul. 24, 1979

[54] ACOUSTIC SURFACE WAVE TRANSDUCER AND FILTER BUILT AROUND THIS TRANSDUCER

[75] Inventors: Anatoly S. Andreev; Alexandr S. Bagdasarian, both of Moskovskaya oblast; Jury V. Gulyaev, Moscow; Anatoly M. Kmita, Moskovskaya oblast, all of U.S.S.R.

[73] Assignee: Institut Radiotekhniki i Elektroniki Akademii Nauk SSSR, Moscow, U.S.S.R.

[21] Appl. No.: 923,547

[22] Filed: Jul. 11, 1978

[30] Foreign Application Priority Data

Jul. 22, 1977 [SU] U.S.S.R. .............................. 2510211

[51] Int. Cl.² .......................................... H01L 41/10
[52] U.S. Cl. ................................. 310/313; 333/193; 333/150
[58] Field of Search ................ 310/313; 333/30 R, 72

[56] References Cited

U.S. PATENT DOCUMENTS

| | | | |
|---|---|---|---|
| 3,600,710 | 8/1971 | Adler et al. | 333/72 |
| 3,894,251 | 7/1975 | Shibayama et al. | 310/313 |
| 3,955,159 | 5/1976 | Mitchell et al. | 333/30 R |
| 4,006,438 | 2/1977 | Bennett | 333/72 |
| 4,035,675 | 7/1977 | Malocha et al. | 310/313 |
| 4,068,141 | 1/1978 | Autran | 310/313 X |

Primary Examiner—Mark O. Budd
Attorney, Agent, or Firm—Holman & Stern

[57] ABSTRACT

An acoustic surface wave interdigital transducer comprises a main and auxiliary rows of electrodes arranged on a piezoelectric substrate. The main row of electrodes comprises a first group of electrodes galvanically connected to a first contact area and a second group of electrodes parallel to the electrodes of the first group and disposed therebetween so that there are formed overlapping portions having the same length. The auxiliary row of electrodes comprises a third group of electrodes galvanically coupled to the second contact area and a fourth group of electrodes parallel to the electrodes of the third group connected directly to the corresponding electrodes of the second group of the main row and disposed between the electrodes of the third group so as to form overlapping portions of electrodes of both groups, said portions having a variable length. The electrodes of the second group of the main row are connected to the second contact area through capacitances. The distances between the longitudinal axes of the adjacent electrodes of the third and fourth groups of the auxiliary row differ from the distances between the longitudinal axes of the electrodes of the first and second groups of the main row. An acoustic surface wave filter built around the above described acoustic surface wave transducer.

17 Claims, 9 Drawing Figures

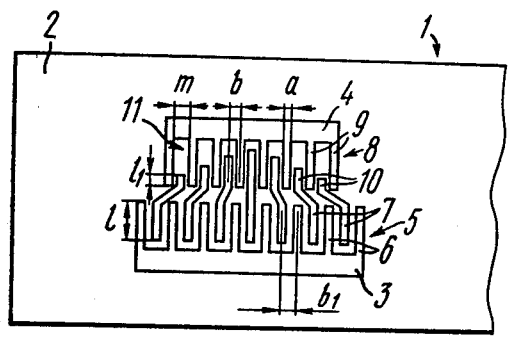
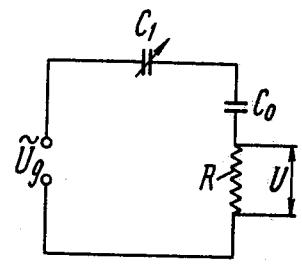
FIG.1  FIG.2
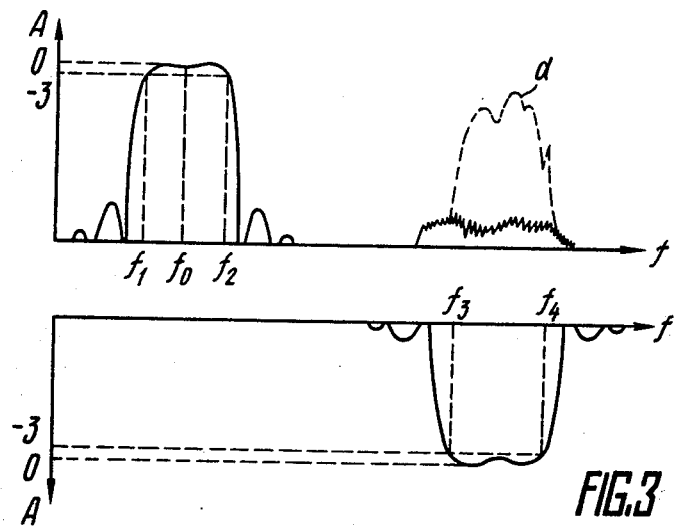
FIG.3

ACOUSTIC SURFACE WAVE TRANSDUCER AND FILTER BUILT AROUND THIS TRANSDUCER

FIELD OF THE INVENTION

The present invention relates to signal processing devices operating with acoustic surface waves and, more particularly, the invention relates to acoustic surface wave transducers and to filters based on such transducers.

The invention may successively be used in different fields of engineering, e.g. in radar and telecommunication systems, automatic systems and computers as a dispersion and non-dispersion delay line filter.

BACKGROUND OF THE INVENTION

Known in the art are acoustic surface wave transducers of the interdigital type, comprising a first contact area and a second contact area disposed on a piezoelectric substrate and a row of electrodes arranged on the piezoelectric substrate and consisting of a first group of electrodes galvanically coupled to the first contact area and a second group of electrodes in parallel to the electrodes of the first group and arranged therebetween so as to form overlapping portions of the electrodes of both groups, the second group of electrodes being galvanically coupled to the second contact area.

It is known (cf. R. H. Tancrell, M. G. Holland "Acoustic Surface Wave Filters", Par. IEEE, vol. 59, No. 3, pp. 393–409, Mar. 1977) that the amplitude-frequency response of an acoustic surface wave transducer is a Fourier transform of its impulse response. When designing such a transducer, the first step comprises, as a rule, calculation of its impulse response, which provides an amplitude-frequency response curve closest in shape to the specified response. In order to obtain a specified impulse response, the intensity of excitation of the acoustic surface waves by each pair of adjacent electrodes must be weighted.

In the above described transducer, this weighing is effected by changing the length of the overlapping portions of the adjacent electrodes of the first and second groups in accordance with a given law of amplitude modulation in the impulse response. Such transducers are known as apodized transducers.

In the known filters, in which the input and output acoustic surface wave transducers are located in a single acoustic channel, one of the transducers, e.g. the input one, is made as an apodized transducer.

An apodized transducer excites acoustic surface waves with a nonuniform wave front along the beam aperture, because each pair of overlapping adjacent electrodes excites acoustic surface waves with a beam width corresponding to the length of the overlapping area. Therefore, the output transducer of the filter must have the same length of the overlapping sections to provide for a transform of the law of change of the electrode overlapping of the input transducer into amplitude modulation of the impulse response without distortion. Thus, in the known filter, the amplitude-frequency response is provided in one transducer only, which does not make it possible to obtain a high level of signal suppression outside of the limits of the filter pass band. Furthermore, with a small area of the overlapping portions of the adjacent electrodes of the apodized transducer, diffraction effects become manifest so that the front of the acoustic surface waves excited by these electrodes is converted from planar into a circular one. This distorts the impulse response of the filter and increases energy losses in its pass band.

In order to increase the level of suppression of the signal beyond the filter pass band, it is desirable to shape its amplitude-frequency response both in the input and output transducers. It can be made in a filter, in which both transducers are apodized and arranged in parallel acoustic channels interconnected through a multistrip system of electrodes (cf. J. M. Deacon, J. Housway, J. A. Jenkins "Multistrip Coupler in Acoustic Surface Wave Filters", Electr. Let., v. 9, No. 10, p. 235, 1973).

The amplitude-frequency response of such a filter is a product of the amplitude-frequency responses in the input and output transducers, which provides for better suppression of the signal outside of the filter pass band. However, the diffraction effects and associated disadvantages are not eliminated in this filter. Additional losses of energy in the pass band of such a filter occur during the transfer of the acoustic surface waves from the acoustic channel of the input transducer into the acoustic channel of the output transducer.

Also known in the art are acoustic surface wave transducers, in which the weighing of the intensity of excitation of the acoustic surface waves is effected by changing the capacitances coupling the transducer electrodes with the contact areas (cf. U.S. Pat. No. 3,904,996; cl. 333–72).

In one embodiment of such a transducer, each contact area has a surface layer of a dielectric, on which there are arranged sections of electrodes of a corresponding group so as to provide a capacitor between each electrode and the corresponding contact area. The capacitance of this capacitor is defined by the area of said portions of the electrodes and is varied by changing the area of these portions from electrode to electrode in accordance with the specified impulse response of the transducer. Such a weighing technique makes it possible to obtain transducer electrodes having the same overlapping length along the entire length of the transducer so that all pairs of adjacent electrodes excite acoustic surface waves with an identical width of the beam but with a different amplitude. When such a transducer is used in a filter, the second transducer can be apodized, which allows the amplitude-frequency response of the filter to be shaped in both transducers.

However, the presence of a dielectric layer on the contact areas results in a number of significant disadvantages of the above described design of the transducer. First of all, the process of manufacture of the transducer is considerably complicated since it includes several steps; making of contact areas, application of a dielectric layer thereon while providing precision checking of its thickness, and making of electrodes. When the electrodes are being made using a photolithographic technique, the photostencil has to be placed on the dielectric layer whose thickness is commensurate with the width of the electrodes. As a result, a gap is formed between the photostencil and the substrate. This causes erosion of the electrode edges and limits the highest possible operating frequency of the transducer compared to the transducers described above. Furthermore, punctures and other defects of the dielectric layer are possible, which result in bridging the electrodes with the contact areas and, therefore, in reduction of the output of suitable products.

It has been proposed to use acoustic surface wave interdigital transducers comprising a first and second contact areas arranged on a piezoelectric substrate and a main row of electrodes located on the piezoelectric substrate and comprising a first group of electrodes electrically connected to the first contact area and a second group of electrodes parallel to the electrodes of the first group and arranged therebetween so as to form overlapping portions of electrodes of both groups having the same length and coupled to the second contact area through capacitors whose capacitances are defined by a specified impulse response of the transducer (cf. U.S. Pat. No. 3,904,996, Cl. 333-72).

In such a transducer, the electrical coupling of the electrodes of the first group to the first contact area is also provided through capacitors whose capacitances are defined by a specified impulse response of the transducer. These capacitors are formed by the recesses of the contact areas and the ends of the electrodes entering these recesses. The capacitance of each capacitor depends on the depth of the recess and the width of the gap between the end of the corresponding electrode and the contact area. A required law of change of the capacitances of the capacitors along the length of the transducer is provided by changing the depth of the recesses and the width of the gap between the ends of the corresponding electrodes and the contact area, i.e. of two parameters. This considerably hampers the calculation of the transducer.

Such a design of the transducer results in high energy losses and distortion of the amplitude-frequency response within the pass band of this device and also in a low level of suppression of the signal outside of this band. All this stems from the fact that the acoustic surface waves within the pass band of the transducer are excited not only at the points of overlapping of the electrodes of the first and second groups but also in the gaps between the contact areas and the electrodes of the corresponding groups. In this case, the above mentioned diffraction effects appear at portions with shallow recesses. These effects result in distortion of the impulse response and, therefore, in distortion of the amplitude-frequency response in the pass band of the transducer and poor suppression of the signal outside of the pass band.

Acoustic surface wave filters were proposed comprising an input and output interdigital transducers, in which the main rows of electrodes are arranged on a piezoelectric substrate in a single acoustic channel (cf. U.S. Pat. No. 3,904,996; cl. 333-72).

In such a filter, one transducer, e.g. the input one, is made as described above, while the output transducer is apodized. On the other hand, the output transducer may be made identical to the input one.

This filter has all disadvantages inherent in the above described acoustic surface wave transducer.

SUMMARY OF THE INVENTION

An object of the present invention is to provide an acoustic surface wave interdigital transducer ensuring low energy losses and distortion of the amplitude-frequency response in the transducer pass band.

Another object of the present invention is to provide an acoustic surface wave interdigital transducer allowing one to considerably simplify the calculations when designing this transducer.

Still another object of the invention is to provide an acoustic surface wave interdigital transducer making it possible to increase the level of suppression of the signal outside of the pass band of the transducer.

Yet another object of the invention is to provide a filter based on said transducer.

These and other objects are attained by that in an acoustic surface wave interdigital transducer comprising a first and second contact areas disposed on a piezoelectric substrate and a main row of electrodes arranged on the piezoelectric substrate and comprising a first group of electrodes electrically connected to the first contact area and a second group of electrodes parallel to the electrodes of the first group arranged therebetween so as to form overlapping portions of electrodes of both groups having the same length and connected to the second contact area through capacitors whose capacitances are defined by a specified impulse response of the transducer, according to the invention, the transducer includes a first auxiliary row of electrodes arranged on a piezoelectric substrate between the main row of electrodes and the second contact area and comprising a third group of electrodes galvanically coupled to the second contact area and a fourth group of electrodes parallel to the electrodes of the third group connected directly to the corresponding electrodes of the second group of the main row and arranged between the electrodes of the third group so that at least a part of them, together with the electrodes of the third group, have overlapping portions of electrodes of both groups of a variable length; each electrode of the fourth group, together with the adjacent electrodes of the third group and the adjoining portion of the second contact area, provides a capacitive coupling of the corresponding electrode of the second group of the main row to the second contact area, in which case the distances between the longitudinal axes of the adjacent electrodes of the third and fourth groups of the first auxiliary row are selected so that they differ from the distances between the longitudinal axes of the electrodes of the first and second groups of the main row.

It is expedient that the transducer include a second auxiliary row of electrodes arranged on a piezoelectric substrate between the main row of electrodes and the first contact area and comprising a fifth group of electrodes galvanically coupled to the first contact area and a sixth group of electrodes parallel to the electrodes of the fifth group connected directly to the corresponding electrodes of the first group of the main row and arranged between the electrodes of the fifth group so that at least a part of them has overlapping portions of electrodes of both groups of a variable length with the electrodes of the fifth group; each electrode of the sixth group, together with the adjacent electrodes of the fifth group and the adjoining section of the first contact area, forms a capacitor which couples the corresponding electrode of the first group of the main row to the first contact area, the capacitance of this capacitor being defined by a specified impulse response of the transducer; the distances between the longitudinal axes of the adjacent electrodes of the fifth and sixth groups of the second auxiliary row are selected so that they differ from the distances between the longitudinal axes of the electrodes of the first and second groups of the main row and of the third and fourth groups of the first auxiliary row.

It is desirable that the distances between the longitudinal axes of the adjacent electrodes of at least one auxiliary row be selected so that the frequency band of the acoustic surface waves excited by the electrodes of this auxiliary row is outside of the specified frequency band of the acoustic surface waves excited by the electrodes of the main row.

It is advisable that the distances between the longitudinal axes of the adjacent electrodes of at least one auxiliary row be additionally selected so that the frequency band of the acoustic surface waves excited by the electrodes of this auxiliary row overlaps the frequency range corresponding to the burst on the amplitude-frequency response of the transducer located outside of the specified frequency band of the acoustic surface waves excited by the electrodes of the main row.

It is advisable that the distances between the longitudinal axes of the adjacent electrodes of at least one auxiliary row be additionally selected so that the frequency band of the acoustic surface waves excited by the electrodes of this auxiliary row overlaps the frequency band corresponding to the side lobes on the amplitude-frequency response of the transducer.

These and other objects are also attained by providing an acoustic surface wave filter comprising an input and output acoustic surface wave interdigital transducers, in which the main rows of electrodes are arranged on a piezoelectric substrate in a single acoustic channel, in which, according to the invention, at least one acoustic surface wave transducer is made as described above.

When the input and output acoustic surface wave transducers are provided with a single auxiliary row of electrodes, the auxiliary rows of electrodes of both transducers can be arranged on either side of said acoustic channel.

When the above described acoustic surface wave transducers are made in the manner described above, the distances between the longitudinal axes of the adjacent electrodes of at least one auxiliary row of the input transducer are preferably selected so that they differ from the distances between the longitudinal axes of the adjacent electrodes of at least one auxiliary row of the output transducer.

It is desirable that the filter include at least one acoustic surface wave absorber arranged relative to at least one auxiliary row so that it absorbs the acoustic surface waves excited by the electrodes of this row.

It is advisable that the acoustic surface wave absorber be located directly on the auxiliary row of electrodes.

It is expedient that the acoustic surface wave absorber be located between the input and output transducers at a certain distance from the auxiliary row of electrodes.

Such a design of the acoustic surface wave transducer, according to the invention, and of the filter based on this transducer makes it possible to reduce losses of energy and distortion of the amplitude-frequency response in the pass band of the transducer (filter), to increase the level of suppression of the signal outside of the pass band of the transducer (filter), and to simplify the calculations involved in the process of designing the transducer.

BRIEF DESCRIPTION OF THE DRAWINGS

These and other objects of the present invention will be apparent upon consideration of a particular embodiment thereof with reference to the accompanying drawings, in which:

FIG. 1 is a top view of an acoustic surface wave interdigital transducer, according to the invention, with a single auxiliary row of electrodes;

FIG. 2 is an equivalent circuit diagram of the transducer shown in FIG. 1;

FIG. 3 is an amplitude-frequency response of the transducer shown in FIG. 1;

FIG. 6 shows the amplitude-frequency response of the transducer of FIG. 5;

DETAILED DESCRIPTION OF THE INVENTION

Figure 4:
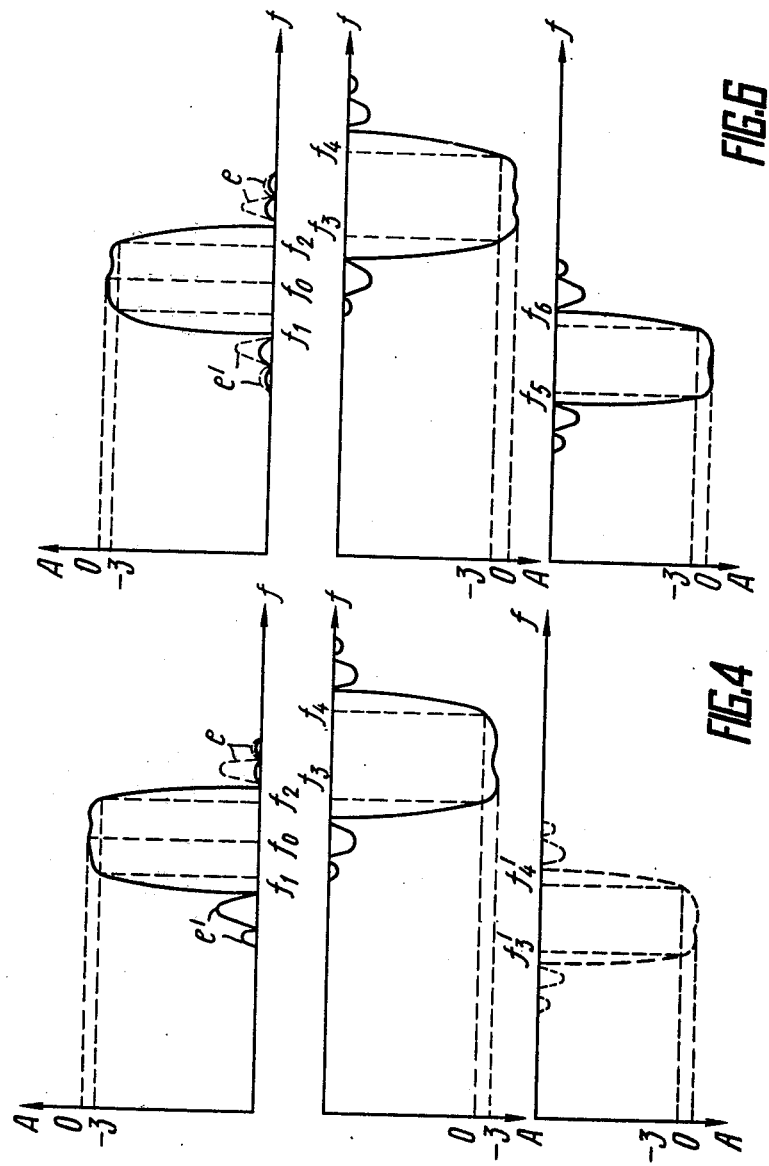
FIG. 4 shows another amplitude-frequency response of the transducer shown in FIG. 1.

According to the present invention, an acoustic surface wave interdigital transducer 1 (FIG. 1) comprises a piezoelectric substrate 2, on which there are located a first contact area 3, a second contact area 4, a main row 5 of electrodes 6, 7, a first auxiliary row 8 of electrodes 9, 10 disposed between the main row 5 of electrodes 6, 7 and the second contact area 4.

The main row 5 of electrodes 6, 7 consists of a first group of electrodes 6 galvanically coupled to the contact area 3 and a second group of electrodes 7 parallel to the electrodes 6 disposed therebetween so as to form overlapping portions of electrodes 6 and 7, said portions having an equal length 1.

The auxiliary row 8 of electrodes 9, 10 comprises a third group of electrodes 9 galvanically coupled to the contact area 4 and a fourth group of electrodes 10 parallel to the electrodes 9 connected directly to the corresponding electrodes 7 of the main row 5 and disposed between the electrodes 9 so as to form overlapping portions of the electrodes 9 and 10 of a variable length $1_f$. It should be noted that the variable length $1_f$ of the overlapping portions of the electrodes 9, 10 can be formed by a variable length of the electrodes 10, which is shown in FIG. 1, and/or variable length of the electrodes 9. In this case, it is also necessary to take into account the fact that only some electrodes 9 and 10 of the auxiliary row 8 can have overlapping portions.

Each electrode 10 of the fourth group, together with the adjacent electrodes 9 of the third group and the adjoining section m of the second contact area 4, forms a capacitor II connecting the corresponding electrode 7 of the second group of the main row 5 to the second contact area 4. The capacitance of each capacitor II depends on the length $1_f$ of the overlapping portions of the electrodes 9 and 10 and is defined by a specified impulse response of the transducer.

According to the invention, the calculation of the transducer is reduced to definition of the law of change of the length $1_f$ of the overlapping portions of the electrodes 9 and 10 of the auxiliary row 8 along the transducer. This calculation can be based on an equivalent circuit for a pair of adjacent electrodes 6 and 7 of the main row 5 of the transducer, according to the invention. To this end, first the magnitude of the equivalent capacitance $C_f$ (FIG. 2), which must be inserted into the equivalent circuit in series with the resistance R of radiation in order to obtain a required amplitude of the acoustic surface waves. The amplitude of the acoustic surface waves excited by a pair of electrodes 6 and 7 of the transducer at a centre operating frequency $f_o$ is proportional to the voltage U therebetween. The magnitude of U is found in accordance with the equivalent circuit through the expression $$U = U_g \cdot \frac{R}{\left[R^2 + \frac{1}{(2\pi f o)^2} \cdot \left(\frac{1}{C_2} + \frac{1}{C_0}\right)^2\right]^{\frac{1}{2}}}, \text{ where}$$

$U_g$ = voltage of the high-frequency generator,
$R$ = resistance of radiation of a pair of adjacent electrodes 6 and 7 of the main row 5.
$C_o$ = static capacitance of a pair of adjacent electrodes 6 and 7 of the main row 5,
$C_I$ = capacitance II between the electrode 7 of the second group of the main row 5 and the second contact area 4.

The capacitance $C_I$ is found from the above expression by setting a ratio $U/U_g$ providing a required amplitude of acoustic surface waves excited by the given pair of electrodes.

After that, calculation is made to find the length $l_I$ of the overlapping portion of the adjacent electrodes 9 and 10 of the auxiliary row 8 with which the calculated capacitance is realized $$l_I = (C_I/C_{II}) \tag{2},$$

where $C_I$ is the capacitance per unit length of the adjacent electrodes 9 and 10.

The capacitance $C_{II}$ is found from the relation $$C_{II} = 2(\epsilon_1 + 1)[6.5 \cdot (a/b)^2 + 1.08 \cdot a/b + 2.37] \cdot 10^{12} \tag{3}$$

Here, $\epsilon_1$ is the equivalent specific dielectric constant of the material of the piezoelectric substrate 2, which is determined by the expression $$\epsilon_1 = 1/\epsilon_o \cdot (\epsilon_{11}\epsilon_{33} - \epsilon_{13}^2)^{1/2} \tag{4}$$

where $\epsilon_o$ = specific dielectric constant of vacuum,
$\epsilon_{11}, \epsilon_{33}, \epsilon_{13}$ = components of the tensor of the specific dielectric constant of the substrate material (the direction II coincides with the direction of propagation of acoustic surface waves),
$a/b$ = the ratio of the electrode width a (FIG. I) of the electrode 9 or 10 to the distance b between the longitudinal axes of two adjacent electrodes 9 and 10 of the auxiliary row 8.

In the described embodiment of the transducer, according to the invention, the distances b between the longitudinal axes of the adjacent electrodes 9 and 10 of the third and fourth groups of the auxiliary row 8 are selected so that they differ from the distance $b_I$ between the longitudinal axes of the electrodes 6 and 7 of the first and second groups of the main row 5. The distance $b_1$ between the longitudinal axes of the adjacent electrodes 6 and 7 of the main row 5 may be constant along the whole length of the row or be changed in accordance with a given law. In the first case, this distance is determined by the centre operating frequency $f_o$ of the transducer and is equal to $$b_1 = v/2f_o, \tag{5}$$

where v = the propagation velocity of the acoustic surface waves. In the second case, this distance is determined by a well known method, through the centre frequency and pass band of the transducer (cf. W. R. Smith, H. M. Gerard, W. R. Jones "Analysis and Design of Dispersive Interdigital Surface Wave Transducers," JEEE Trans., MIT-20, No. 7, July 1972, p. 458).

In order to reduce the energy loss in the frequency band of the transducer, the distances b between the longitudinal axes of the adjacent electrodes 9 and 10 of the auxiliary row 8 are preferably selected so that the frequency band of the acoustic surface waves excited by the electrodes 9 and 10 of this auxiliary row 8 is outside of the given frequency band $f_1$-$f_2$ (FIG. 3) of the acoustic surface waves excited by the electrodes 6 and 7 of the main row 5.

Thus, for the transducer shown in FIG. I in case of the presence of bursts on the amplitude-frequency response of the transducer, which are located beyond the transducer frequency band and caused by the excitation of the harmonic acoustic surface waves or parasitic volume waves, the distances b between the longitudinal axes of the adjacent electrodes 9 and 10 of the auxiliary row 8 are preferably selected so that the frequency band $f_3$-$f_4$ (FIG. 3) of the acoustic surface waves excited by the electrodes 9 and 10 of this auxiliary row 8 overlaps the frequency band corresponding to one of said bursts (e.g. burst d) on the amplitude-frequency characteristic of the transducer. (In FIG. 3 a frequency f is laid on the abscissa, while the intensity A of the acoustic surface waves in db are laid on the ordinate).

In the other case, when it is necessary to obtain a higher level of suppression of the side lobes on the amplitude-frequency characteristic of the transducer shown in FIG. I, the distances b between the longitudinal axes of the electrodes 9 and 10 of the auxiliary row 8 are selected so that the frequency band $f_3$-$f_4$ (FIG. 4) of the acoustic surface waves excited by the electrodes 9 and 10 of this auxiliary row 8 overlaps the frequency band corresponding to said side lobes e or $e^I$. (In FIG. 4 on the axes there are plotted the same data as on the axes in FIG. 3).

We have described an embodiment of the invention in the form of an acoustic surface wave transducer having two rows of electrodes.

The present invention can have another embodiment, which is preferably used in devices requiring a high level of suppression of the signal outside of the frequency band of the device.

This transducer I (FIG. 5) is similar to that shown in FIG. I. A distinctive feature of this transducer is that it additionally includes a second auxiliary row 12 of electrodes 13, 14 arranged on a piezoelectric substrate 2 between the main row 5 of electrodes 15, 16 and the first contact area 3.

Figure 5:
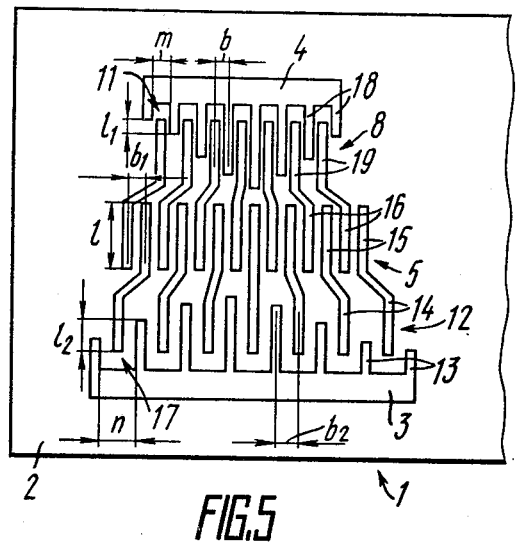
FIG. 5 is a top view of an acoustic surface wave interdigital transducer with two auxiliary rows of electrodes, according to the invention.

The auxiliary row 12 comprises a fifth group of electrodes 13 connected to the first contact area 3 and a sixth groups of electrodes 14 parallel to the electrodes 13 connected directly to the corresponding electrodes 15 of the fifth group of the main row 5 and disposed between the electrodes 13 so that they have with the electrodes 13 overlapping portions of a variable length $l_2$. It should be taken into account that the variable length $l_2$ of the overlapping electrodes 13, 14 can be formed by the variable length of the electrodes 13, as shown in FIG. 5, or/and the variable length of the electrodes 14. In this case, it is also necessary to take into consideration that some electrodes 13 and 14 of the second auxiliary row 12 can have overlapping portions.

Each electrode 14 of the sixth group, together with the adjoining electrodes 13 of the fifth group and the adjoining portion n of the first contact area 3, forms a capacitor 17, which connects the corresponding electrode 15 of the first group of the main row 5 with the first contact area 3 and the capacitance of which is defined by a specified impulse response of the transducer.

The calculation of this transducer is carried out as described above. In this case, the capacitance $C_1$ in the equivalent circuit according to FIG. 2 is a sum of two seriesly connected capacitances 17 and 11 connecting the electrodes 15 and 16 of the main row 5 to the contact areas 3 and 4 respectively.

In the embodiment of the invention shown in FIG. 5, the variable length $l_f$ of the overlapping portions of the electrodes 18, 19 of the auxiliary row 8 is formed by the variable length of the electrodes 18 of the third group of this row.

The distances $l_2$ between the longitudinal axes of the adjacent electrodes 13 and 14 of the second auxiliary row 12 are selected so that they differ from the distances $b_1$, b between the longitudinal axes of the electrodes 15 and 16 of the main row 5 and of the electrodes 18, 19 of the first auxiliary row 8.

In the embodiment of the transducer being described, the selection of the distances b, $b_1$, $b_2$ is made in the same way as the selection of the distances b, $b_f$ in the transducer shown in FIG. I.

For this transducer the distances $b_2$, b between the longitudinal axes of the electrodes 13, 14 and 18, 19 of the auxiliary rows 12 and 8 are preferably selected so that the frequency bands $f_3-f_4$ and $f_5-f_6$ (FIG. 6) of the acoustic surface waves excited, respectively, by the electrodes 18, 19 and 13, 14 of these auxiliary rows 8 and 12 overlap the frequency bands corresponding to the side lobes e and e' on the amplitude-frequency response of the transducer and located on either of the entre frequency $f_o$. (The same magnitudes are plotted on the axes in FIG. 6 as those on the axes in FIGS. 3 and 4).

The present invention also includes a filter built around the above-described acoustic surface wave transducer.

Figure 7:
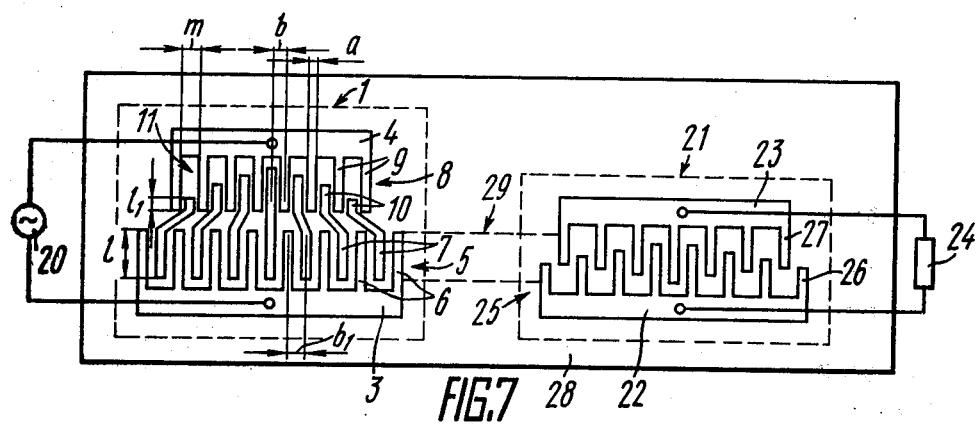
FIG. 7 is a top view of a filter built around the transducer shown in FIG. 1, according to the invention.

Thus, FIG. 7 shows an acoustic surface wave filter, according to the invention, built around an input acoustic surface wave interdigital transducer 1 made in accordance with FIG. 1 and having contact areas 3 and 4 connected to a high-frequency generator 20 and a known output apodized acoustic surface wave interdigital transducer 21 (cf. R. H. Tancrell, M. G. Holland "Acoustic Surface Wave Filters", Proc. IEEE, vol. 59, No. 3, pp. 393–409, Mar. 1971) having contact areas 22 and 23 connected to a load 24. The transducer 21 includes a main row 25 of electrodes 26 and 27 galvanically connected to the contact areas 22 and 23, respectively. The main rows 5 and 25 of electrodes 6, 7 and 26, 27 of the transducers 1 and 21 are arranged on a piezoelectric substrate 28 in a single acoustic channel 29.

Figure 8:
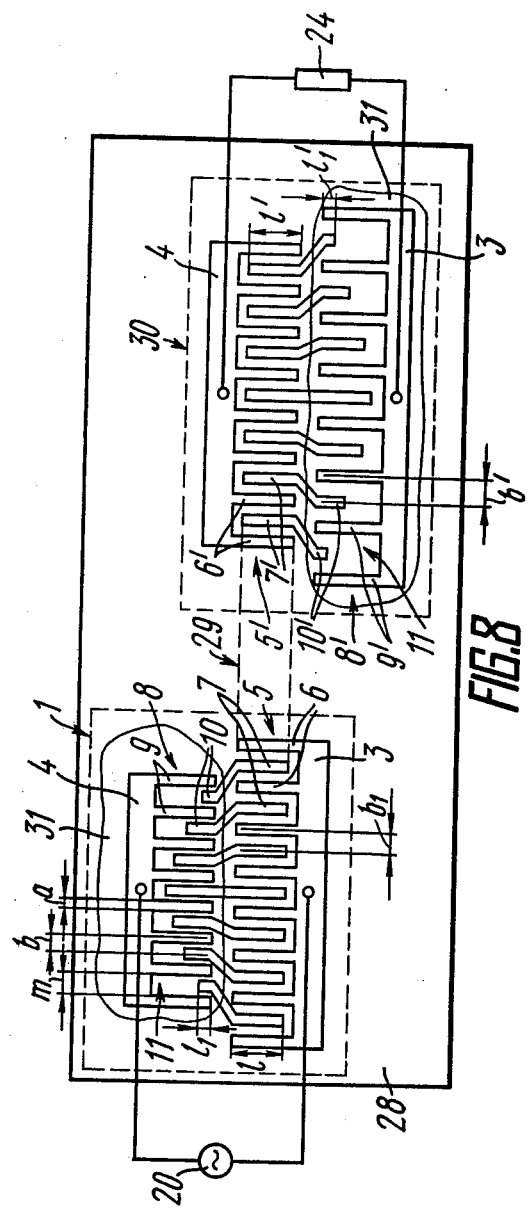
FIG. 8 is a top view another embodiment of the filter built around the transducer shown in FIG. 1, according to the invention (a top view)

FIG. 8 shows a version of the filter according to the invention, in which both the input acoustic surface wave transducer 1 and the output acoustic surface wave transducer 30 are made according to FIG. 1. The auxiliary rows 8 and 8' of the electrodes 9, 10 and 9', 10' of these transducers are arranged at both sides from said acoustic channel 29 while the main rows 5 and 5' of electrodes 6, 7 and 6', 7' are arranged in this channel.

In this embodiment the distances b between the longitudinal axes of the adjacent electrodes 9 and 10 of the auxiliary row 8 of the input transducer 1 are selected so that they differ from the distance b' between the longitudinal axes of the adjacent electrodes 9' and 10' of the auxiliary row 8' of the output transducer 30.

In particular, these distances b and b' can be selected so that the frequency bands $f_3-f_4$ and $f_3'$ and $f_4'$ (FIG. 4) of the acoustic surface waves are excited respectively by the electrodes 9, 10 and 9' and 10' of the auxiliary rows 8 and 8' overlap the frequency bands corresponding to the side lobes e and e' on the amplitude-frequency response located on either side of the centre frequency $f_o$.

The filter shown in FIG. 8 includes acoustic surface wave absorbers 31 so disposed with respect to each of the auxiliary rows 8 and 8' that they absorb the surface acoustic waves excited by the electrodes 9, 10 and 9', 10' of these rows. In the given case, the absorbers 31 are arranged directly on the auxiliary rows 8 and 8' of electrodes 9, 10 and 9', 10'. Such absorbers can be made of a material having a high dielectric constant, e.g. of epoxy resin with barium titanate powder as a filler. In this case, the capacitance of the capacitor 11 per unit length of the overlapping electrodes 9, 10 and 9', 10' of the auxiliary rows 8 and 8' increases and this allows the transverse dimension of the transducer to be reduced.

Figure 9:
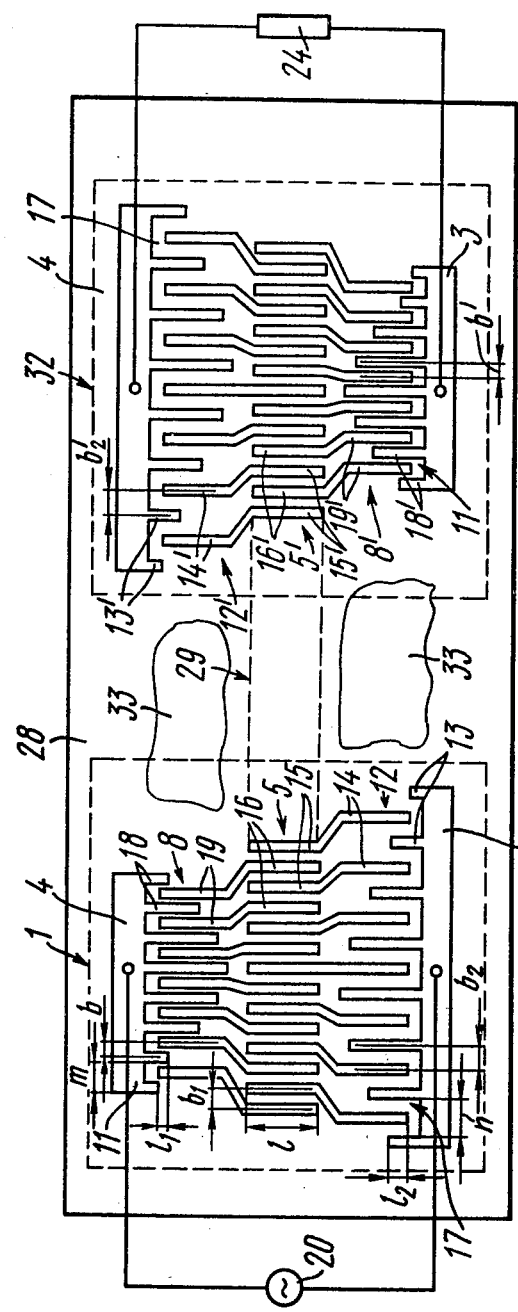
FIG. 9 is a top view of the filter built around the transducer shown in FIG. 5.

In the embodiment of the filter according to the invention shown in FIG. 9 the input 1 and out 32 acoustic surface wave transducers are made according to FIG. 3. In this embodiment of the inventions all the distinctive features of the filter according to FIG. 8 are preserved. Thus, the main rows 5 and 5' of electrodes 15, 16 and 15', 16' are arranged in a single acoustic channel 29. The first auxiliary rows 8 and 8' of electrodes 18, 19 and 18', 19' are disposed at both sides of the acoustic channel 29 as well as the second auxiliary rows 12 and 12' of electrodes 13, 14 and 13', 14'.

The difference lies in that the acoustic surface wave absorbers 33 are disposed between the input 1 and output 32 transducers at some distance from the auxiliary rows 8 and 12 along the path of propagation of the acoustic surface waves excited by the electrodes of these rows.

Described so far were embodiments of the filter according to the invention, which have acoustic surface wave absorbers for each auxiliary row. However, embodiments of the invention are possible, which have no absorbers of the acoustic surface waves excited by the electrodes of the auxiliary rows.

In such a design of the filter, the distances between the longitudinal axes of the electrodes of the auxiliary rows of the input and output transducers disposed at one side of the acoustic channel are selected so that the frequency band of the acoustic surface waves excited by the electrodes of the auxiliary row of the input transducer is outside of the frequency band of the acoustic surface waves excited by the electrodes of the auxiliary row of the output transducer.

It should be noted that in all the above described embodiments of the transducers and filters based thereon the electrodes of the auxiliary rows may be arranged both in parallel and non-parallel to the electrodes of the main rows. In the second case the electrodes of the auxiliary rows must be arranged at such an angle to the electrodes of the main rows that the acoustic surface waves excited by the electrodes of the auxiliary row of one transducer do not reach the main and auxiliary rows of the other transducer.

The principle of operation of the acoustic surface wave transducer according to the invention will be considered on an example of a filter built around this transducer.

The filter made according to the present invention and shown in FIG. 7 operates as follows.

When a signal from the high-frequency generator 20 (FIG. 7) comes to the first 3 and second 4 areas between the adjacent electrodes 6 and 7 of the first and second groups of the main row 5, and a-c potential appears due to the resistive coupling of the electrodes 6 of the first group to the first contact area 3 and due to the capacitive coupling of the electrodes 7 of the second group to the second contact area 4. The voltage across each pair of electrodes and, therefore, the intensity of the electric field therebetween depends on the capacitance between the corresponding electrodes 7 of the second group and the second contact area 4, i.e. on the length $l_1$ of the overlapping portions of the corresponding electrodes 10 and 9 of the fourth and third groups of the auxiliary row 8. As a result, in the piezoelectric substrate 2 there are excited acoustic surface waves in the frequency band close to the centre pass band frequency $f_o$ of the filter. The amplitude of the acoustic surface waves excited by each pair of adjacent electrodes 6 and 7 of the main row 5 is proportional to the intensity of the electric field therebetween and, therefore, depends on the length $l_1$ of the overlapping portions of the corresponding adjacent electrodes 9 and 10 of the auxiliary row 8. Thus, the weighing of the intensity of excitation of acoustic surface waves by the electrodes of the main row 5 and, therefore, the shaping of a specified impulse response is effected by giving a definite law of overlapping of the electrodes of the auxiliary row 8. In this case the acoustic surface waves excited by the electrodes of the main row 5 have a uniform wave front along the beam aperture, since all electrodes of this row have overlapping portions of the same length 1. Therefore, the main row 5 is free from diffraction effects distorting the impulse response shaped by the electrodes of this row.

In a similar way, the electrodes 9 and 10 of the auxiliary row 8 excite acoustic surface waves, since the electrodes 9 of the third group of this row are resistively coupled to the second contact area 4 while the electrodes 10 of the fourth group are inductively coupled to the first contact area 3. In this case the frequency band of the acoustic surface waves excited by the electrodes 9, 10 of the auxiliary row 8 is outside of the pass band of the filter, which is dicated by the above said selection of the distance between the longitudinal axes of the adjacent electrodes 9, 10 of this row. Therefore, said acoustic surface waves do not cause additional energy losses in the pass band of the filter and do not distort the impulse response shaped by the electrodes 6, 7 of the main row 5.

The acoustic surface waves excited by the electrodes 6 and 7 of the main row 5 of the input transducer 5 propagate along the acoustic channel 29, come to the output transducer 21 and are converted by the electrodes 25, 27 of this transducer into an electric signal fed to a load 24. The acoustic surface waves excited by the electrodes 9, 10 of the auxiliary row 8 are dispersed. Since the transducer 21 is apodized, the amplitude of the electric signal appearing on each pair of electrodes 26, 27 is proportional to the length of the overlapping portions of these electrodes, i.e. the output transducer 21 also produces an impulse response in accordance with the specified law of overlapping of its electrodes.

Thus, in the above described filter, the impulse response is shaped both in the input and output transducers and the resultant amplitude-frequency response of the filter is a product of the amplitude-frequency responses in the input 1 and output 21 transducers.

When the distances b between the longitudinal axes of the electrodes 9, 10 of the auxiliary row 8 are selected so that the frequency band $f_2$–$f_4$ (FIG. 3) of the acoustic surface waves excited by these electrodes overlaps the frequency band corresponding to the burst d on the amplitude-frequency response of the transducer, these acoustic surface waves introduce dissipative energy losses in said frequency band $f_3$–$f_4$. Thus, the amplitude of the acoustic surface waves excited by the electrodes 6, 7 of the main row 5 of the transducer in the frequency band $f_3$–$f_4$ is reduced. This results in a decrease in the burst d on the resultant amplitude-frequency response of the filter.

In a similar way, the level of the side lobes e (FIG. 4) on the amplitude-frequency response of the filter is reduced when the distances b between the longitudinal axes of the electrodes 9, 10 of the auxiliary row 8 are selected so that the frequency band $f_3$–$f_4$ of the acoustic surface waves excited by these electrodes overlaps the frequency band corresponding to the lobes e on the amplitude-frequency response of the transducer.

The filter show in FIG. 8 operates in a way similar to that of the above described filter except that the amplitude of the electric signal appearing across each pair of electrodes 6', 7' of the main row 5' of the output transducer 30 acted on by the acoustic surface waves fed from the main row 5 of the input transducer 1 is proportional to the length $l_1$ of the overlapping portions of the electrodes 9', 10' of the auxiliary row 8' of the output transducer 30. Thus, a specified impulse response of this filter is provided by setting a definite law of overlapping of the electrodes 9, 10 and 9', 10' of the auxiliary rows 8 and 8' of the input 1 and output 30 transducers.

Since all electrodes 6', 7' of the main row 5' of the output transducer 30 have overlapping portions of the same length $1^2$, it is free from diffraction effects, which are also absent in the main row 5 of the input transducer 1. This permits one to obtain an amplitude-frequency response of the filter, which is close to a desirable characteristic.

The acoustic surface waves excited by the electrodes 9, 10 and 9', 10' of the auxiliary rows 8 and 8' of the input 1 and output 30 transducers are absorbed in the absorbers 31.

When the distances b and b' between the longitudinal axes of the electrodes 9, 10 and 9', 10' of the auxiliary rows 8 and 8' of the input 1 and output 30 transducers are selected so that the frequency bands $f_3$–$f_4$ and $f_3'$–$f_4'$ (FIG. 4) of the surface acoustic waves excited by the electrodes of these rows overlap the frequency bands corresponding to the side lobes e and e' on the amplitude-frequency response of the filter, the level of these lobes is reduced due to the fact that said acoustic surface waves introduce dissipative energy losses in the frequency bands $f_3$–$f_4$ and $f_3'$–$f_4'$.

The filter shown in FIG. 9 operates similarly to the filter shown in FIG. 8 except for the fact that the acoustic surface waves excited by the electrodes 13, 14 and 18, 19 of the auxiliary rows 12 and 8 of the input transducer 1 are absorbed in the absorbers 33 disposed between the input 1 and output 32 transducers. Such a design of the filter makes it possible to obtain better suppression of the signal outside of the filter pass band when selecting the distances b, $b_2$ and b', $b_2'$ between the longitudinal axes of the electrodes 18 and 19, 13 and 14, 18' and 19', 13' and 14' of the auxiliary rows 8, 12, and 12', 8' of the input 1 and output 32 transducers in accordance with the recommendations given above.

In particular, if the said distances b, $b_2$, b' and $b_2'$ are selected so that the frequency bands of the acoustic surface waves excited by the said electrodes of the auxiliary rows 8, 12 and 8', 12' of both transducers 1 and 32 are disposed with respect to the filter pass band $f_1$-$f_2$ as shown in FIG. 6, we obtain better suppression of the signals in the frequency range corresponding to the side lobes e and e' on the amplitude-frequency response of the filter.

The advantage of the proposed transducer consists in a possibility of weighing the intensity of the excited acoustic surface waves having a uniform front along the beam aperture. Due to this fact, when using the proposed transducer in the filter according to the present invention, the amplitude-frequency response can be provided both in the input transducer and in the output transducer with insignificant energy loss in the filter pass band, because the auxiliary rows of electrodes of the transducer introduce no additional energy losses in its pass band.

The shape of the amplitude-frequency response provided by the proposed transducer or filter built around this transducer can additionally be improved by increasing the level of suppression of the signal outside of the pass band of the transducer (filter), which is obtained by introducing frequency-selective dissipative energy losses in the auxiliary rows of electrodes of the transducer.

The calculation and design of the proposed transducer are rather simple. The manufacture of this transducer and filter built around the same is identical to the standard manufacturing techniques of acoustic surface wave interdigital transducers and filters based thereon.

In the description of the embodiments of the invention specific terminology is used for clarity. However, the invention is not restricted to the accepted terms and it should be understood that each such term covers all equivalent elements operating in a similar way and used for solving the same technical problems.

Although a preferred embodiment of the invention is described in the present specification, it is clear to those skilled in the art that other modifications may be made without departing from the scope of the invention.

These modifications are within the scope of the present invention as defined by the following claims.

What is claimed is:

1. An acoustic surface wave interdigital transducer comprising:
    a piezoelectric substrate;
    a first contact area arranged on said piezoelectric substrate;
    a second contact area arranged on said piezoelectric substrate;
    a main row of electrodes having longitudinal axes, said row being arranged on said piezoelectric substrate and having a first group of said electrodes electrically connected to said first contact area and a second group of said electrodes in parallel to said electrodes of the first group and disposed therebetween so that overlapping portions of said electrodes of the same length are formed;
    a first auxiliary row of electrodes, having longitudinal axes, arranged on said piezoelectric substrate between the main row of said electrodes and the second contact area; the first auxiliary row of said electrodes including a third group of said electrodes galvanically coupled to the second contact area, and a fourth group of said electrodes parallel to said electrodes of the third group connected directly to the corresponding electrodes of the second group of the main row and arranged between said electrodes of the third group so that at least a part of these have, with said electrodes of the third group, overlapping portions of a variable length; each electrode of the fourth group, together with the adjacent electrodes of the third group and the adjoining portions of the second contact area forming a capacitor which connects the corresponding electrodes of the second group of the main row to the second contact area, the capacitance of this capacitor being defined by a specified impulse response of the transducer; said electrodes of the third and fourth groups of the first auxiliary row being arranged so that the distances between said longitudinal axes of the adjacent electrodes of the third and fourth groups are selected so that they differ from the distances between said longitudinal axes of the adjacent electrodes of the first and second groups of the main row.

2. A transducer as claimed in claim 1, which includes a second auxiliary row of electrodes having longitudinal axes arranged on said piezoelectric substrate between the main row of electrodes and a first contact area; said second auxiliary row of said electrodes including a fifth group of said electrodes galvanically coupled to the first contact area and a sixth group of electrodes parallel to said electrodes of the fifth group connected directly to the corresponding electrodes of the first group of the main row and disposed between said electrodes of the fifth group so that at least a part of them, together with said electrodes of the fifth group, have overlapping portions of a variable length; each electrode of the sixth group and the adjoining portion of the first contact area forming a capacitor which connects the corresponding electrode of the first group of the main row with the first contact area, the capacitance of this capacitor being defined by a specified impulse response of the transducer; said electrodes of the fifth and sixth groups of the second auxiliary row being disposed so that the distances between said longitudinal axes of the adjacent electrodes of the fifth and sixth groups differ from the distances between said longitudinal axes of the adjacent electrodes of the first and second groups of the main row and the third and fourth groups of the first auxiliary row.

3. A transducer as claimed in claim 1, in which said distances between said longitudinal axes of said adjacent electrodes of the first auxiliary row are selected so that the frequency band of the acoustic surface waves excited by the electrodes of this auxiliary row is outside of the specified frequency band of the acoustic surface waves excited by said electrodes of the main row.

4. A transducer as claimed in claim 3, in which said distances between said longitudinal axes of said adjacent electrodes of the first auxiliary row are additionally selected so that the frequency band of the acoustic surface waves excited by said electrodes of this auxiliary row overlaps the frequency range corresponding to the burst on the amplitude-frequency response of the transducer disposed outside of the specified frequency band of the acoustic surface waves excited by said electrodes of the main row.

5. A transducer as claimed in claim 3, in which said distances between said longitudinal axes of said adjacent electrodes of the first auxiliary row are additionally selected so that the frequency band of the acoustic surface waves excited by said electrodes of this auxiliary row overlaps the frequency range corresponding to the side lobes on the amplitude-frequency response of the transducer.

6. A transducer as claimed in claim 2, in which said distances between said longitudinal axes of said adjacent electrodes of the first and second auxiliary rows are selected so that the frequency band of the acoustic surface waves excited by the electrodes of these auxiliary rows is outside of the specified frequency band of the acoustic surface waves excited by said electrodes of the main row.

7. A transducer as claimed in claim 6, in which said distances between said longitudinal axes of said adjacent electrodes of the first or second auxiliary row are additionally selected so that the frequency band of the acoustic surface waves excited by said electrodes of one of the auxiliary rows overlaps the frequency range corresponding to the burst on the amplitude-frequency response of the transducer disposed outside of the specified frequency band of the acoustic surface waves excited by said electrodes of the main row.

8. A transducer as claimed in claim 6, in which said distances between said longitudinal axes of said adjacent electrodes of the first and second auxiliary rows are additionally selected so that the frequency band of the acoustic surface waves excited by said electrodes of these auxiliary rows overlaps the frequency range corresponding to the side lobes on the amplitude frequency response of the transducer.

9. An acoustic surface wave filter comprising:
a piezoelectric substrate;
an input acoustic surface wave interdigital transducer arranged on said piezoelectric substrate;
an output acoustic surface wave interdigital transducer having a main row of electrodes and arranged on said piezoelectric substrate so that this main row of said electrodes is disposed in the same acoustic channel with said main row of said electrodes of said input transducer;
at least one said acoustic surface wave transducer comprising:
a first contact area arranged on said piezoelectric substrate;
a second contact area arranged on said piezoelectric substrate;
said main row of electrodes having longitudinal axes arranged on said piezoelectric substrate; said main row of said electrodes including a first group of said electrodes electrically connected to the first contact area and a second group of said electrodes in parallel to said electrodes of the first group and arranged there between so as to form overlapping portions of said electrodes of the first and second group, said portions having the same length;
a first auxiliary row of electrodes having longitudinal axes arranged on said piezoelectric substrate between the main row of said electrodes and the second contact area; the first auxiliary row of said electrodes including a third group of said electrodes galvanically coupled to the second contact area and a fourth group of said electrodes in parallel to said electrodes of the third group directly connected to the corresponding electrodes of the second group of the main row and disposed between said electrodes of the third group so that at least a part of them have, with the electrodes of the third group, overlapping portions of a variable length; each said electrode of the fourth group, together with the adjacent said electrodes of the third group and the adjoining portion of the second contact area, forming a capacitor which connects the corresponding electrode of the second group of the main row with the second contact area, the capacitance of this capacitor being defined by a specified impulse response of the transducer; said electrodes of the third and fourth groups of the first auxiliary row being disposed so that the distances between said longitudinal axes of the adjacent electrodes of the third and fourth groups differ from the distances between said longitudinal axes of the adjacent electrodes of the first and second groups of the main row.

10. A filter as claimed in claim 9, in which said acoustic surface wave transducer comprising a main row of said electrodes and a first auxiliary row of said electrodes includes a second auxiliary row of electrodes, having longitudinal axes, arranged on said piezoelectric substrate between the main row of electrodes and the first contact area; said second auxiliary row of said electrodes including a fifth group of said electrodes galvanically coupled to the first contact area and a sixth group of electrodes in parallel to said electrodes of the fifth group connected directly to the corresponding electrodes of the first group of the main row and disposed between said electrodes of the fifth group so that at least a part thereof, together with said electrodes of the fifth group has, overlapping portion of a variable length; each electrode of the sixth group, together with the adjacent electrodes of the fifth group and the adjoining portion of the first contact area, forming a capacitor which connects the corresponding electrode of the first group of the main row with the first contact area, the capacitance of this capacitor being defined by a specified impulse response of the transducer; said electrodes of the fifth and sixth groups of the auxiliary row being arranged so that the distances between said longitudinal axes of the adjacent electrodes of the fifth and sixth groups differ from the distances between said longitudinal axes of the adjacent electrodes of the first and second groups of the main row and the third and fourth groups of the first auxiliary row.

11. A filter as claimed in claim 9, in which said distances between said longitudinal axes of said adjacent electrodes of the first auxiliary row are selected so that the frequency band of the acoustic surface waves excited by the electrodes of this auxiliary row is outside of the specified frequency band of the acoustic surface waves excited by said electrodes of the main row.

12. A filter as claimed in claim 9, including said input acoustic surface wave transducer having said main row of said electrodes and said first auxiliary row of said electrodes; said output transducer of acoustic surface waves having a main row of electrodes and a first auxiliary row of electrodes; said auxiliary rows of said electrodes being disposed at both sides of said acoustic channel.

13. A filter as claimed in claim 9, comprising said input acoustic surface wave transducer having said main row of said electrodes and at least one said auxiliary of said electrodes having longitudinal axes; said output acoustic surface wave transducer having a main row of electrodes and at least one auxiliary row of electrodes having longitudinal axes; said electrodes of at least one auxiliary row of said input transducer being arranged so that the distances between said longitudinal axes of the adjacent electrodes of this row differ from the distances between said longitudinal axes of the adjacent electrodes of at least one said auxiliary row of said output transducer.

14. A filter as claimed in claim 9, comprising at least one acoustic surface-wave absorber arranged with respect to at least one said auxiliary row so that it absorbs said acoustic surface waves excited by said electrodes of this row.

15. A filter as claimed in claim 10, in which said distances between said longitudinal axes of said adjacent electrodes of the first and second auxiliary rows are selected so that the frequency band of the acoustic surface waves excited by the electrodes of these auxiliary rows is outside of the specified frequency band of the acoustic surface waves excited by said electrodes of the main row.

16. A filter as claimed in claim 14, in which said acoustic surface wave absorber is arranged directly on said auxiliary row of said electrodes.

17. A filter as claimed in claim 14, in which said acoustic surface wave absorber is disposed between said input and output transducers at some distance from said auxiliary row of said electrodes.

* * * * *